US006834549B2

(12) United States Patent
Shu et al.

(10) Patent No.: US 6,834,549 B2
(45) Date of Patent: Dec. 28, 2004

(54) CHARACTERIZING IN-SITU DEFORMATION OF HARD PELLICLE DURING FABRICATION AND MOUNTING WITH A SENSOR ARRAY

(75) Inventors: Emily Yixie Shu, San Jose, CA (US); Goutam Paul, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/407,902

(22) Filed: Apr. 3, 2003

(65) Prior Publication Data

US 2004/0194556 A1 Oct. 7, 2004

(51) Int. Cl.[7] ............................................... G01D 7/16
(52) U.S. Cl. ........................................................ 73/768
(58) Field of Search ....................... 73/767, 768, 760, 73/762, 763, 781

(56) References Cited

U.S. PATENT DOCUMENTS

| | | | | |
|---|---|---|---|---|
| 4,686,531 A | * | 8/1987 | Shambroom et al. | 324/660 |
| 4,966,457 A | * | 10/1990 | Hayano et al. | 356/239.7 |
| 5,436,464 A | * | 7/1995 | Hayano et al. | 250/559.01 |
| 6,319,635 B1 | * | 11/2001 | Mirkarimi et al. | 430/5 |
| 6,459,491 B1 | * | 10/2002 | Nguyen | 356/604 |
| 6,479,201 B2 | * | 11/2002 | Higashiki | 430/30 |
| 6,489,066 B2 | * | 12/2002 | Mirkanimi | 430/5 |
| 6,563,570 B1 | * | 5/2003 | Okada | 356/35.5 |
| 6,575,035 B2 | * | 6/2003 | Suzuki | 73/579 |
| 6,680,481 B2 | * | 1/2004 | Okino | 250/491.1 |
| 6,686,103 B2 | * | 2/2004 | Eynon | 430/5 |
| 6,693,700 B2 | * | 2/2004 | Shima | 355/53 |

* cited by examiner

Primary Examiner—Max Noori
(74) Attorney, Agent, or Firm—Fish & Richardson P.C.

(57) ABSTRACT

A system comprising a reticle, a pellicle and a plurality of sensors attached to at least one of the reticle or pellicle. The sensors are configured to sense in-situ strains on the pellicle as the pellicle is mounted to the reticle or frame.

36 Claims, 6 Drawing Sheets

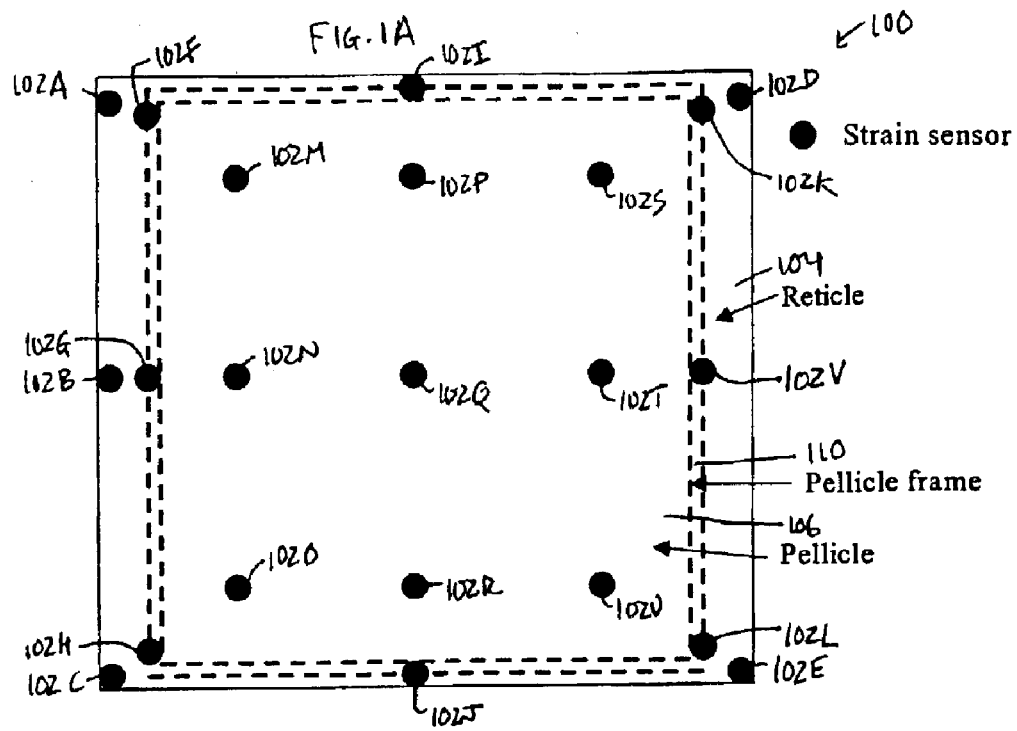
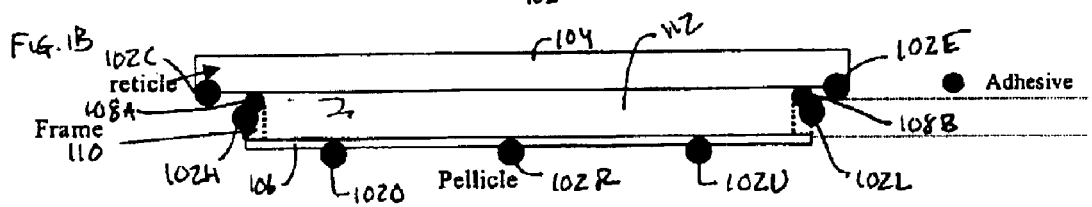
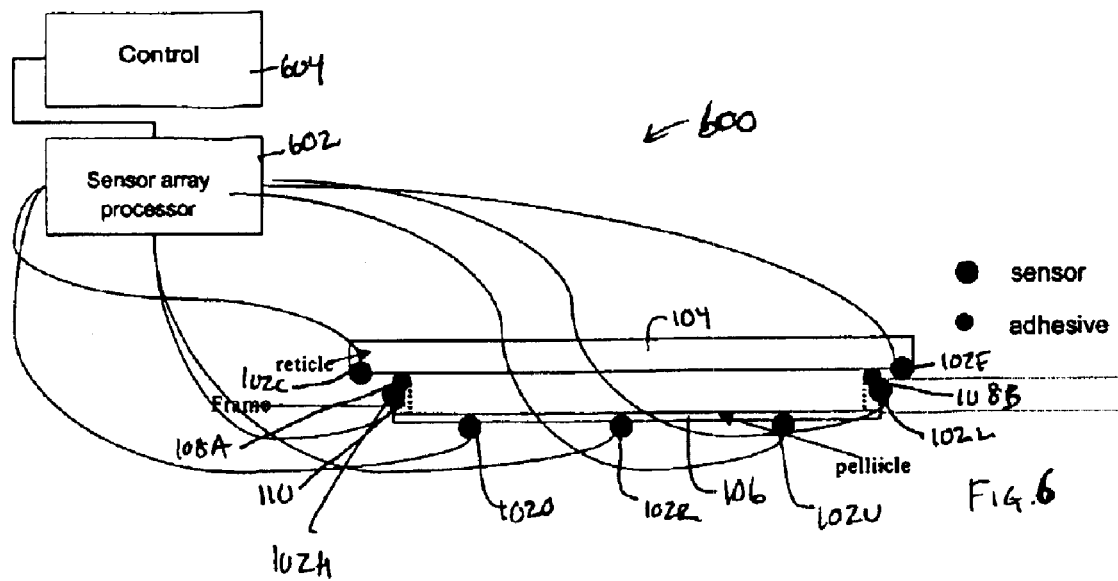

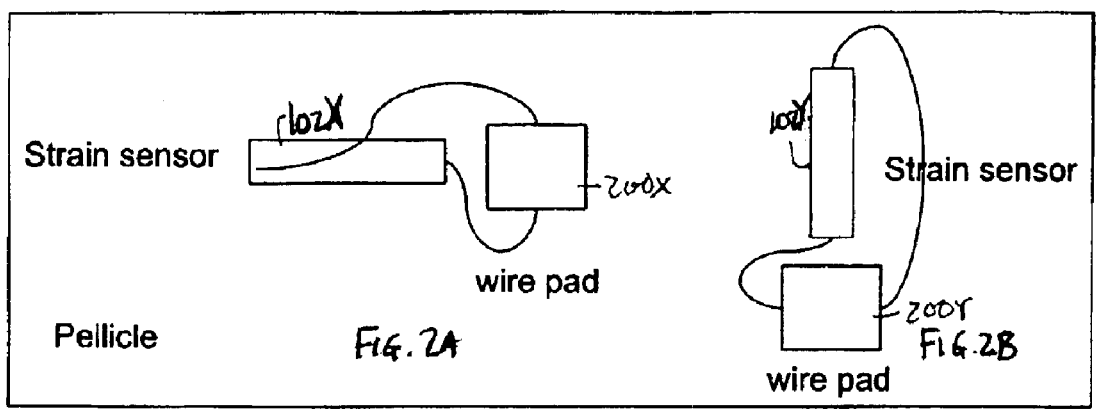

Pellicle system

Pellicle on reticle

CHARACTERIZING IN-SITU DEFORMATION OF HARD PELLICLE DURING FABRICATION AND MOUNTING WITH A SENSOR ARRAY

BACKGROUND

Photolithography systems have been using soft polymer-based pellicles to protect masks/reticles from particle and contamination. The current pellicle mounting technique (pellicle-to-reticle and pellicle-to-frame) is a combined mechanical and chemical adhesion process. Large compression, i.e., a high stress level, is applied to the adjoining reticle and pellicle system with adhesive applied in the gap between them. In order to achieve a hermetical seal and reliable bonding, pressure as high as 27,000 kg/m$^2$ has been commonly applied.

DESCRIPTION OF DRAWINGS

FIGS. 1A and 1B are top and side views of a sensor array around a pellicle system and reticle.

FIGS. 2A–2B illustrate two miniature strain sensors and wire pads.

FIG. 6 illustrates a real-time, feedback mounter control unit, a sensor array processor, the reticle, the pellicle, the frame and sensors.

DETAILED DESCRIPTION

Figure 3:
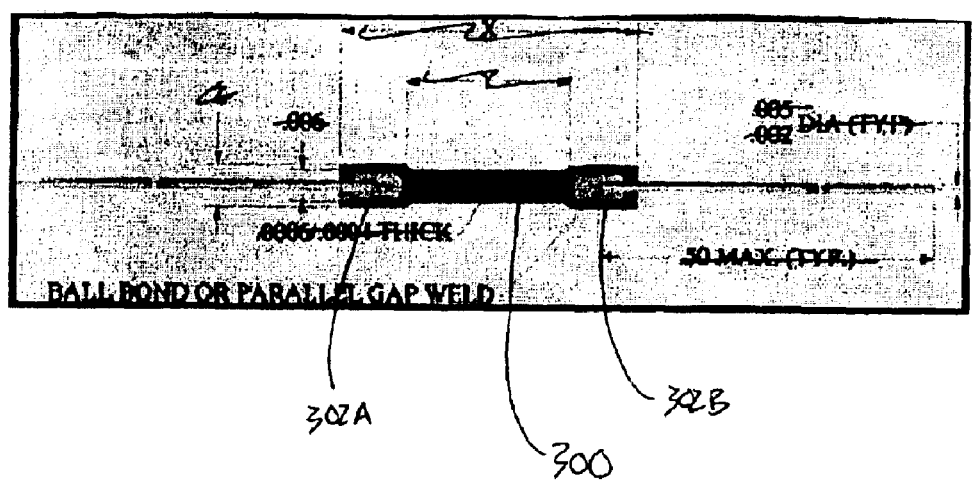
FIG. 3 illustrates an example of a semiconductor-based strain sensor that may be used in FIGS. 1A–1B.

Mask protecting pellicles, which are made of soft polymer materials, lack durability in advanced lithography systems with irradiation wavelengths at about 157-nm. This has led to the development of fused silica or "hard" pellicles. Hard pellicles may allow advanced lithography systems to use wavelengths at about 157 nm.

Pellicle flatness, however, is a challenge to developing fused silica or "hard" pellicles for mounting to reticles. Pellicle surface flatness directly impacts lithographic image quality and overlay. Using the conventional technique to mount a hard pellicle to a reticle has resulted in high local tilts and deformation on the hard pellicle.

The conventional mounting process for polymer-based pellicles is relatively unproblematic because: 1) the polymer film is thin (<1 micron), and the optical aberration from such a thin film is minimal; and 2) the polymer is more flexible than fused silica, which endures low stress during mounting. However, if a conventional mounting process is used for a hard pellicle, uneven stress may build up on the hard pellicle, which results in high tilt and deformation. It has been shown that tilt and deformation add significant aberration to the optical path of lithography tools and consume a large fraction of the distortion error budget, which is already extremely tight in 157-nm lithography. The current mounting equipment and process, when applied to hard pellicles, induces very high distortion for lithography, which is undesirable. Fused silica has not been used in lithography for production.

A possible quantitative measurement technique for characterizing a mounter is to apply stress-sensing load cells in a set up without pellicles. But the results cannot provide real force distribution on a fused silica pellicle. Other methods may include color pressure films, which are only qualitative. Neither technique can provide information on the pellicle or frame deformation. In spite of extensive efforts from the lithography industry to improve the hard pellicle-mounting process, high local tilt on a hard pellicle remains a significant challenge for the success of this technology.

The present application relates to systems and methods for sensing/characterizing in-situ strain, stress and deformation of a "hard" (e.g., fused silica) pellicle. The systems may provide a force deflection landscape for hard pellicle attachment processes and equipment. The methods may involve diagnosing, monitoring, and understanding pellicle deformation problems of a conventional mounting process described above. The methods may monitor dynamic mounting force distribution and mechanisms, which are responsible for pellicle surface tilt and bending. The methods may identify areas of improvement to reduce pellicle surface tilt and bending. A mechanical stress model, such as the finite element model/method (FEM) simulation, may be applied to better understand the methods, by using the sensor array data as mechanical load inputs.

FIGS. 1A and 1B are top and side views of a sensor array 102A–102V around a lithographic or mask pellicle system 106 and reticle 104, which may be tested during mounting. FIG. 1B illustrates the pellicle 106 mounted to a frame 110, which is mounted to the reticle 104 by adhesive 108A–108B. The frame 110 supports the pellicle 106.

Reticle, Pellicle and Frame

Pellicle and reticle dimensions may vary according to a suppliers' design. The reticle 104 may comprise a material such as quartz. As an example, the reticle 104 may have an area of 152 mm×152 mm in FIG. 1A. The pellicle 106 may comprise a "hard" pellicle material, such as fused silica, calcium bromide, calcium fluoride or other materials, which are transparent at a desired lithographic wavelength. The pellicle 106 may have an area of a few inches wide and placed at a distance of a few millimeters away from the reticle in FIG. 1B. There may be a space 112 between the reticle 104 and pellicle 106. The frame 110 may have a depth of a few millimeters in FIG. 1B and a surface thickness of a fraction of a millimeter, as shown by the dotted outline in FIG. 1A. Alternatively, other dimensions of the reticle 104, pellicle 106 and frame 110 may be implemented.

The frame 110 of the pellicle 106 is highlighted in dashed lines, where sensors 102F, 102G, 102H, 102J, 102L, 102V, 102K, 102I may be attached to the corners and the middle of each side. Sensors 102M, 102N, 102O, 102P, 102Q, 102R, 102S, 102T, 102U may be placed close to the edges and the center of the pellicle 106. The sensors may be attached to the frame 110, pellicle 106 and/or reticle 104 with a bonding material, glue, adhesive or some other method.

Sensors

The sensors 102A–102V may include a set of miniature strain gages made of piezoelectric, piezoelectric tube or transducer (PZT), or micro-electromechanical systems (MEMS). The sensors 102A–102V may be semiconductor-based. The sensors 102A–102V may be calibrated. The sensors 102A–102V may be a few micrometers (e.g., two to four micrometers) in size (e.g., thickness) and may be attached on one or more surfaces of the pellicle 106, the reticle 104 and/or the frame 110 at different locations as shown in FIG. 1A. The sensors 102A–102V may be placed in a number of arrangements and locations, which are not limited to FIGS. 1A–1B. The small sensors 102A–102V may be attached without adding stress or bulk to the thin and fragile pellicle 106, or obstructing the mounting process.

The sensors 102A–102V may be very sensitive due to the high gage factor of the material property and the particular geometric design one can implement because of their small size. The sensors 102A–102V may measure/monitor/detect/sense flatness, in-plane displacement, in-situ strain, deflection and distributed mounting forces on the hard pellicle 106 and material deformation caused by strain on the pellicle 106 and reticle 104 during mounting. The mounting may be a dynamic pellicle mounting process, i.e., pellicle-to-frame mounting (also called pellicle membrane to frame mounting) or frame-to-mask mounting (also called pellicle-to-mask mounting or pellicle system to reticle mounting). In-situ strain monitoring for hard pellicles may be important in several pellicle related processes.

FIGS. 2A–2B illustrate two strain sensors 102X, 102Y and wire pads 200X, 200Y. Each sensor gage 102 may typically provide in-plane strain data along one direction, but respond insensitively to strain in other directions. Thus, two perpendicularly attached gages 102X, 102Y in proximity may acquire real two-dimensional in-plane strain, i.e., detect strain in two directions.

The sensors 102A–102V may be commercially available instruments configured to measure surface strain. The sensors 102A–102V may comprise a commercially available, prefabricated wire layer/matrix/mesh of sensors. FIG. 3 illustrates an example of a semiconductor-based sensor 300 that may be used in FIGS. 1A–1B. The sensor 300 may be obtained from Micron Instruments in Simi Valley, Calif., which manufactures semiconductor strain gages made of doped silicon. Through standard lithography and etch processes, film gages may be made out of silicon wafers with a few micron thickness. Signal outputs and power connections 302A–302B supporting the gage 300 may be made to small pads attached to nearby areas on the target (pellicle, reticle or frame). These pads may be connected through wires to signal conditioning electronics and computers. The connections 302A, 302B may have a ball bond or parallel gap weld.

In photolithographic equipment, a reticle and pellicle may be designed to fit in a tight space, which gives little room for monitoring devices to share the same space. The peripheral space around the pellicle 106, which may be used for sensors, may often be small, e.g., several microns. Semiconductor-based thin-film gages may adhere to the pellicle frame 110 or any pellicle and/or reticle surface location to provide mounting stress, force uniformity, and strain distribution information over the entire pellicle system. These gages may preferably be at the center and corners for the frame sides and the center and middle points of the pellicle 106 to obtain an envelop of the strain field, which may be used to evaluate the distortions by Finite Element Method analysis.

Figure 4:
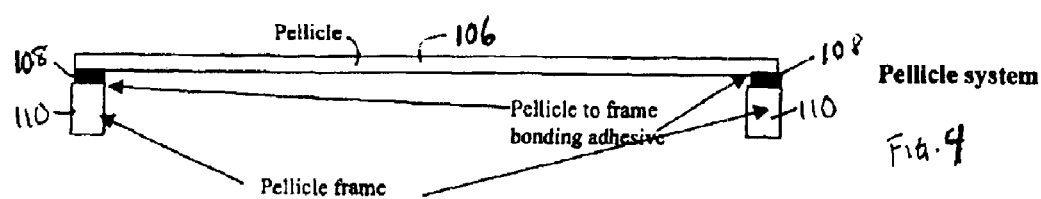
FIG. 4 illustrates a pellicle being mounted to a frame 110 by bonding adhesive.

FIG. 4 illustrates a pellicle 106 being mounted to a frame 110 by bonding adhesive 108. Flatness of the pellicle 106 may be monitored and controlled by a real-time sensor system 600 (FIG. 6).

Figure 5:
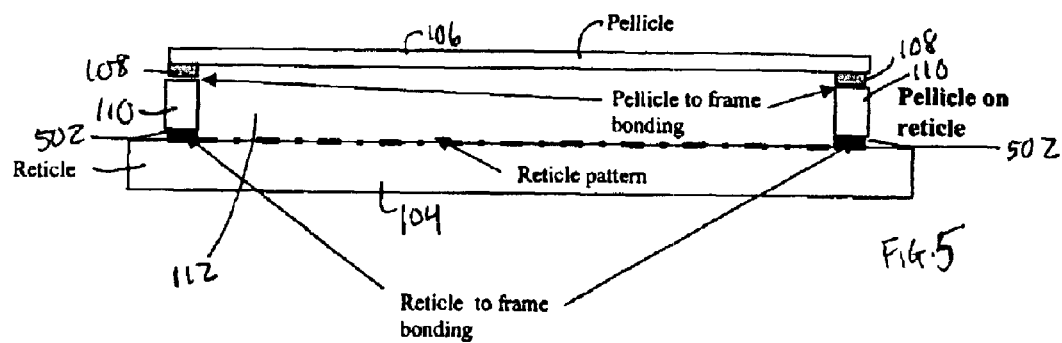
FIG. 5 illustrates the pellicle system frame being mounted to a reticle by reticle-to-frame bonding.

FIG. 5 illustrates the pellicle system frame 110 being mounted to a reticle 104 by reticle-to-frame bonding 502. The dynamic behaviors of the pellicle system may be monitored during exposure tool scanning, $N_2$ purging from the space 112, and other processes, when the reticle 104 is in the middle of the lithographic process.

Using Data from the Sensors

FIG. 6 illustrates a real-time, feedback mounter control unit 604, a sensor array processor 602, the reticle 104, the pellicle 106, the frame 110 and sensors 102A–102V (only sensors 102C, 102H, 102O, 102R, 102U, 102L and 102E are shown in FIG. 6). The sensing system 600 may be used for pellicle-to-mask mounting and/or pellicle-to-frame mounting. The sensors 102A–102V send measured strain or force data to the array processor 602, which sends the data to the control unit 604. The sensor array processor 602 may assess mounting force uniformity and dynamics, force distribution characteristics, stiffness and deformation of materials, and dynamics of the mounting process.

After the mapping of strain distribution is completed, data may be applied/combined with mechanical modeling simulation tools, such as finite element models (FEMs). Pellicle system health may then be verified and improved quantitatively. The analysis may help improve mounting equipment and processes.

The feedback and control unit 604 collects and processes the data from the array processor 602. The feedback and control unit 604 provides feedback to a pellicle mounting machine to adjust pellicle mounting in order to acquire a desired shape for the monitored target. Data from the in-situ sensors 102A–102V may be used to map out force distribution of the mounting equipment, adjust the mounting parameters from a feedback system, and finally improve the equipment hardware.

The acquired distributed force data from in-situ strain sensor measurements may help improve fabrication and attachment processes of hard pellicles and equipment, which may be used for advanced lithography with wavelengths at or lower than 157 nm. The methods herein may correlate force deformation parameters, mechanical stiffness and dynamic mounting with lithographic data, such as image fidelity and distortion.

Figure 7:
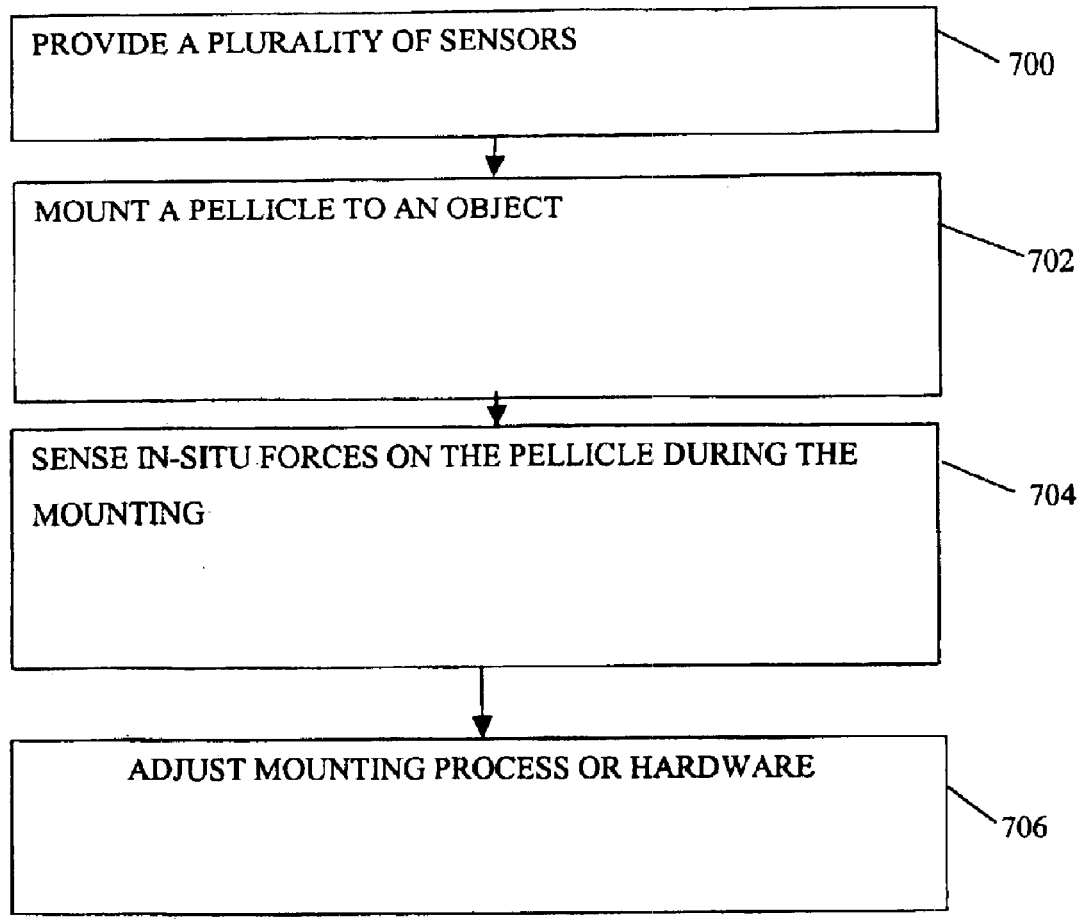
FIG. 7 illustrates a method of using the sensor array system described above.

FIG. 7 illustrates a method of using the sensor array system described above. A plurality of sensors 102A–102V is provided at 700. A pellicle 106 is mounted to an object (frame 110 or reticle 104) at 702. Sensors 102A–102V sense in-situ forces on the pellicle 106 during mounting at 704. The method adjusts mounting process or hardware at 706.

Local Tilt of Conventional Mounting

A conventional mechanical mounter cannot satisfy a hard pellicle flatness requirement for local tilt of less than 10 micro radians, which is desired for lithographic image quality. The mounter is typically characterized at the factory without real hard pellicle data (usually, polymer pellicle data may be provided).

Figures 8A, 8B:
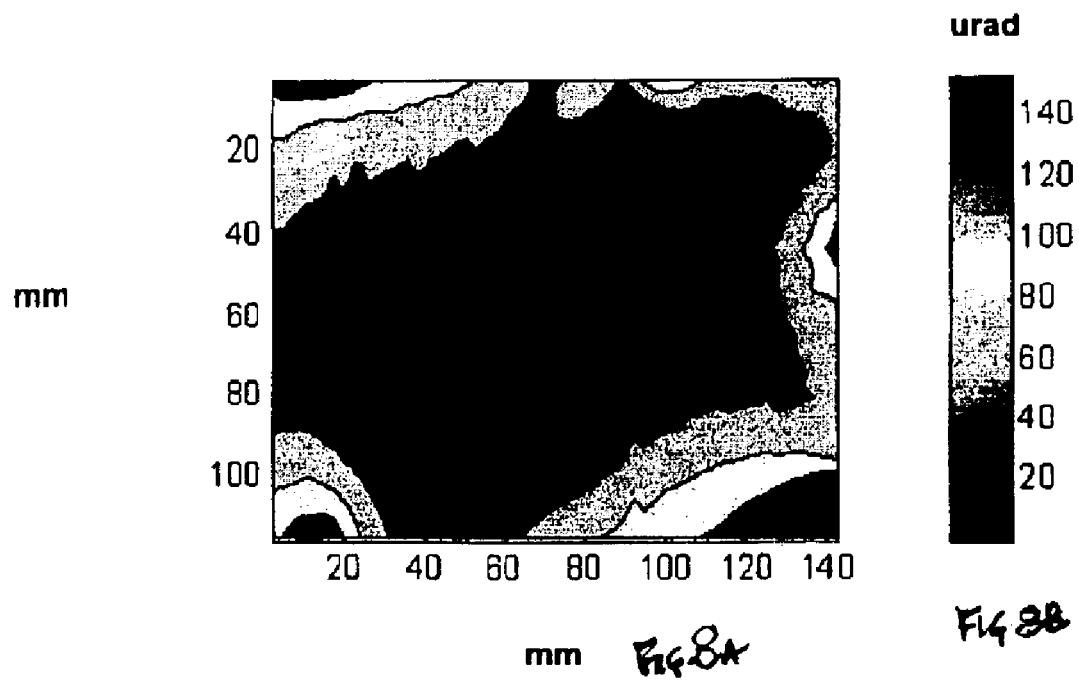
FIGS. 8A–8B illustrate an example of post-mount pellicle flatness data of a conventional mechanical mounter.

FIGS. 8A–8B illustrate an example of post-mount pellicle flatness data of a conventional mechanical mounter. Two perpendicular axes of a pellicle surface are along the y and x axes in millimeters. The total image distortion error budget for the pellicle 106 is about 1 nm, or about 10 micro radians in out-of-plane pellicle deflection. FIG. 8A illustrates high local deformation on the pellicle surface. The local tilts contour plot of a pellicle are in microradians ($\mu$rad). 1 nm image distortion=12 $\mu$rad tilt in flatness. FIG. 8B shows a scale of local tilt in microradians.

Figure 9:
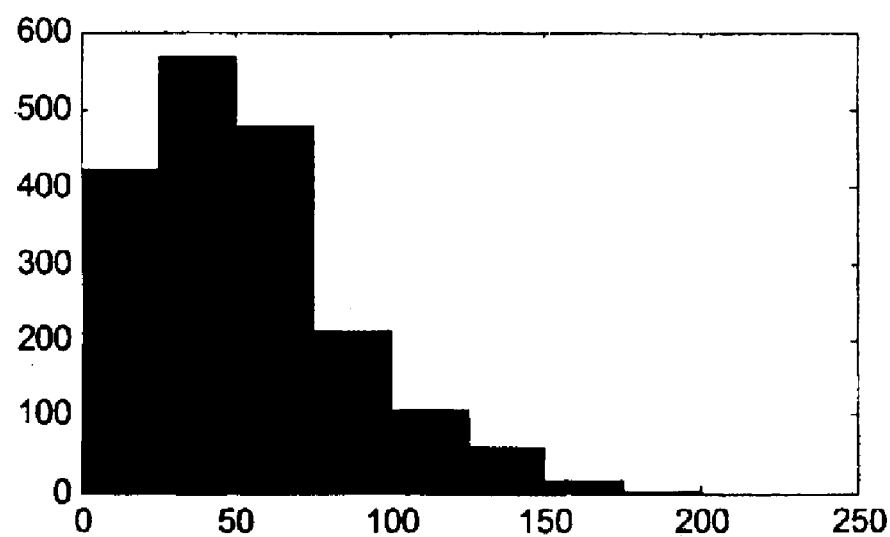
FIG. 9 is a histogram of local tilt from the same pellicle sample in FIGS. 8A–8B.

FIG. 9 is a histogram of local tilt ($\mu$rad) from the same pellicle sample in FIGS. 8A–8B. The y-axis represents the number of occurrences of local tilt along the x-axis, which represents the amount of local tilt in microradians. The data shown in FIGS. 8A–9 may be used to adjust pellicle mounting methods.

A number of embodiments have been described. Nevertheless, it will be understood that various modifications may be made without departing from the spirit and scope of the application. Accordingly, other embodiments are within the scope of the following claims.

What is claimed is:

1. A system comprising:
   a pellicle to be used in photolithography;
   a plurality of sensors to measure surface strain of the pellicle as the pellicle is mounted to an object;
   a processor to couple to the sensors and to process data from the sensors; and
   a pellicle mounter to mount the pellicle according to the processed data to minimize pellicle mounting error.

2. The system of claim 1, wherein the sensors comprise strain gages.

3. The system of claim 1, wherein the sensors comprise piezoelectric transducers.

4. The system of claim 1, wherein the sensors comprise microelectromechanical systems (MEMS).

5. The system of claim 1, wherein the sensors are attached to the pellicle.

6. The system claim 1, wherein the sensors are attached proximate to an outer edge of the pellicle.

7. The system of claim 1. wherein the sensors are used in orthogonal pairs to acquire two directional in-plane strains.

8. The system of claim 1, wherein the sensors are attached to a reticle.

9. The system of claim 1, wherein the sensors are attached to a frame mounted to the pellicle.

10. The system of claim 1, wherein each sensor is about two to four micrometers in thickness.

11. The system of claim 1, wherein the sensors are operative to measure in-situ distributed forces on the pellicle.

12. The system of claim 1, wherein the sensors are operative to monitor material deformation.

13. The system of claim 1, further comprising a mechanical stress model to map surface strain across the pellicle and to reduce pellicle mounting error.

14. The system of claim 1, wherein the object is a reticle.

15. The system of claim 1, wherein the object is a frame.

16. A mask pellicle system comprising:
   a plurality of sensors to measure surface deflection of the mask pellicle as the mask pellicle is mounted to an object;
   a processor to process deflection data from the sensors and coupled to the sensors; and
   a feedback and control unit to collect data from the processor and reduce mask pellicle mounting error.

17. The system of claim 16, wherein the processor is operative to use a mechanical stress model to map surface strain across the mask pellicle.

18. A system to reduce pellicle mounting error comprising:
   a reticle;
   a pellicle; and
   a plurality of sensors attached to at least one of the reticle or pellicle, wherein the sensors are operative to sense forces on the pellicle as the pellicle is mounted to the reticle;
   an array processor to couple to the sensors and to process measurements from the sensors; and
   a mounter control to couple to the array processor, the mounter control being operative to adjust pellicle mounting based on processed measurements from the array processor.

19. The system of claim 18, wherein the sensors are operative to sense any of the following forces on the pellicle as the pellicle is mounted to the reticle: in-situ forces; in-plane displacement forces; deflection forces; distributed mounting forces; and material deformation forces.

20. The system of claim 19, wherein the mounter control is operative to reduce pellicle mounting error based on the processed measurements.

21. The system of claim 1, further comprising a feedback and control unit operative to collect data from the processor.

22. The system of claim 18, wherein the pellicle is made of fused silica.

23. The system of claim 18, wherein the reticle is made of quartz.

24. The system of claim 18, further comprising a frame supporting the pellicle.

25. The system of claim 18, wherein the sensors are operative to measure deformation of the pellicle.

26. A method comprising:
   mounting a pellicle to an object; and
   sensing in-situ forces on the pellicle with a plurality of strain-gage sensors during the mounting.

27. The method of claim 26, wherein the object is a reticle.

28. The method of claim 26, wherein the object is a frame.

29. The method of claim 26, wherein mounting the pellicle to the object comprises applying an adhesive and applying a force to the pellicle and object.

30. The method of claim 26, further comprising processing the sensed in-situ forces to reduce deformation.

31. A method comprising:
   mounting a pellicle to an object;
   sensing in-situ forces on the pellicle with a plurality of sensors during the mounting; and
   adjusting the mounting based on said sensed forces.

32. The method of claim 26, further comprising attaching a plurality of sensors to the pellicle before mounting.

33. The method of claim 26, further comprising attaching a plurality of sensors to the object before mounting.

34. The system of claim 21, wherein the feedback and control unit is operative to provide feedback to a pellicle mounting machine to reduce pellicle mounting error.

35. The system of claim 16, wherein the plurality of sensors are distributed across the mask pellicle.

36. The system of claim 17, wherein the mechanical stress model comprises a finite element model (FEM) simulation.

* * * * *